US012807843B2

(12) United States Patent
Lee et al.

(10) Patent No.: US 12,807,843 B2
(45) Date of Patent: Nov. 24, 2026

(54) METHOD OF MANUFACTURING CHEMICAL MECHANICAL POLISHING SLURRY AND METHOD OF MANUFACTURING SEMICONDUCTOR DEVICE USING THE SAME

(71) Applicant: Samsung Electronics Co., Ltd., Suwon-si (KR)

(72) Inventors: Sanghwa Lee, Suwon-si (KR); Yearin Byun, Suwon-si (KR); Inkwon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 253 days.

(21) Appl. No.: 18/610,982

(22) Filed: Mar. 20, 2024

(65) Prior Publication Data

US 2024/0318038 A1 Sep. 26, 2024

(30) Foreign Application Priority Data

Mar. 24, 2023 (KR) ........................ 10-2023-0039245
May 24, 2023 (KR) ........................ 10-2023-0067143

(51) Int. Cl.
*C09G 1/02* (2006.01)
*B82Y 40/00* (2011.01)
(Continued)

(52) U.S. Cl.
CPC ................ *C09G 1/02* (2013.01); *B82Y 40/00* (2013.01); *C07F 5/003* (2013.01); *C09K 3/1409* (2013.01);
(Continued)

(58) Field of Classification Search
CPC .......... C09G 1/02; B82Y 40/00; C07F 5/003; C09K 3/1409; C09K 13/00; C09K 3/1463; H10P 52/403; H10P 95/062; H10P 52/40
See application file for complete search history.

(56) References Cited

U.S. PATENT DOCUMENTS 8,057,561 B2 11/2011 White et al.
8,541,310 B2 9/2013 White et al.
(Continued)

FOREIGN PATENT DOCUMENTS

KR 101184488 B1 9/2012
KR 101823083 B1 1/2018
(Continued)

OTHER PUBLICATIONS

Estes, Shanna L., et al., "Tetravalent Ce in the Nitrate-Decorated Hexanuclear Cluster [Ce6(μ3-O)4(μ3-OH)4]12+: A Structural End-point for Ceria Nanoparticles", The Journal of Physical Chemistry, (Feb. 17, 2016) 32 pages.
(Continued)

*Primary Examiner* — Anita K Alanko
(74) *Attorney, Agent, or Firm* — Wolf, Greenfield & Sacks, P.C.

(57) ABSTRACT

Provided are a method of manufacturing a chemical mechanical polishing slurry and a method of manufacturing a semiconductor device using the same. The method of manufacturing a chemical mechanical polishing slurry includes mixing a first precursor including cerium and a second precursor in an aqueous solution, forming nanoclusters including cerium by a reaction (e.g., a synthesis reaction) between the first precursor and the second precursor, and forming a chemical mechanical polishing slurry by mixing at least one of a pH adjuster, deionized water, an inhibitor, a booster, and a dispersant with the nanoclusters.

20 Claims, 10 Drawing Sheets

(51) Int. Cl.

| | |
|---|---|
| ***C07F 5/00*** | (2006.01) |
| ***C09K 3/14*** | (2006.01) |
| ***C09K 13/00*** | (2006.01) |
| ***H10P 52/40*** | (2026.01) |
| ***H10P 95/00*** | (2026.01) |

(52) U.S. Cl.

CPC ............ *C09K 13/00* (2013.01); *H10P 52/403* (2026.01); *H10P 95/062* (2026.01); *H10P 52/40* (2026.01)

(56) References Cited

U.S. PATENT DOCUMENTS

| | | | |
|---|---|---|---|
| 9,206,337 | B2 | 12/2015 | Jung |
| 9,932,497 | B2 | 4/2018 | Iwano et al. |
| 10,196,542 | B2 | 2/2019 | Minami et al. |
| 11,207,663 | B2 | 12/2021 | Christou et al. |
| 11,505,470 | B2 | 11/2022 | Christou et al. |
| 2019/0211245 | A1 | 7/2019 | Choi et al. |
| 2022/0389278 | A1 | 12/2022 | Go et al. |

FOREIGN PATENT DOCUMENTS

| | | | | |
|---|---|---|---|---|
| KR | 102034331 B1 | | 10/2019 | |
| KR | 102373924 B1 | | 3/2022 | |
| KR | 102399810 B1 | | 5/2022 | |
| KR | 102487301 B1 | | 1/2023 | |
| WO | WO-2022189597 A1 | * | 9/2022 | ............ C01F 17/235 |

OTHER PUBLICATIONS

Mathey, Laurent , et al., "Cerium(IV) Hexanuclear Clusters from Cerium(III) Precursors: Molecular Models for Oxidative Growth of Ceria Nanoparticles", Chem. Eur. J. 21:13454-13461 (Jul. 31, 2015).

Smolders, Simon , et al., "A precursor method for the synthesis of new Ce(IV) MOFs with reactive tetracarboxylate linkers", ChemComm, 00:1-3 (2013).

Son, Young-Hye , et al., "Super fine cerium hydroxide abrasives for SiO2 film chemical planarization performing scratch free", Scientific Reports 11:17736 (Sep. 5, 2021) 11 pages.

* cited by examiner (a) pH3 (b) pH5 (c) pH7

METHOD OF MANUFACTURING CHEMICAL MECHANICAL POLISHING SLURRY AND METHOD OF MANUFACTURING SEMICONDUCTOR DEVICE USING THE SAME

CROSS-REFERENCE TO RELATED APPLICATIONS

This application claims priority under 35 U.S.C. § 119 to Korean Patent Application No. 10-2023-0039245, filed on Mar. 24, 2023 and Korean Patent Application No. 10-2023-0067143, filed on May 24, 2023 in the Korean Intellectual Property Office, the disclosures of all of which are incorporated by reference herein in their entireties.

BACKGROUND

The inventive concept relates to a method of manufacturing a chemical mechanical polishing slurry and a method of manufacturing a semiconductor device using the same, and more particularly, to a method of manufacturing a slurry used in a chemical mechanical polishing process for a non-metal-containing film and a method of manufacturing a semiconductor device using the same.

Due to the development of electronics technology, demand for high integration of semiconductor devices is increasing and downscaling thereof is in progress. As the degree of integration of semiconductor devices (or integrated circuit devices) increases, a multi-layer wiring structure that connects functional elements such as transistors, capacitors, and resistors to each other is being used. In order to form such a multi-layer wiring structure, a chemical mechanical polishing process for planarizing a non-metal-containing film such as an insulating material layer or a semiconductor material layer may be used. A chemical mechanical polishing slurry may be used in chemical mechanical polishing process(es).

SUMMARY

The inventive concept provides a method of manufacturing a chemical mechanical polishing slurry capable of improving planarity or flatness and reducing or preventing scratch defects during chemical mechanical polishing of a non-metal-containing film.

The inventive concept provides a method of manufacturing a semiconductor device using the chemical mechanical polishing slurry.

According to some embodiments of the present inventive concept, a method of manufacturing a chemical mechanical polishing slurry, the method includes mixing a first precursor including cerium and a second precursor in an aqueous solution, forming nanoclusters including cerium by a reaction (e.g., a synthesis reaction) between the first precursor and the second precursor, and forming the chemical mechanical polishing slurry by mixing a pH control agent, deionized water, an inhibitor, a booster, and/or a dispersant with the nanoclusters.

According to some embodiments of the present inventive concept, a method of manufacturing a chemical mechanical polishing slurry, the method includes mixing a first precursor including cerium in an aqueous solution, mixing a second precursor in the aqueous solution, and synthesizing nanoclusters by a reaction (e.g., a synthesis reaction) between the first precursor and the second precursor in the aqueous solution at a temperature in a range from about 10 °C. to about 30 °C., wherein the nanoclusters include cerium hexanuclear nanoclusters including polyvalent anions including cerium atoms.

According to some embodiments of the present inventive concept, a method of manufacturing a semiconductor device, the method includes forming, on a substrate, a feature pattern (e.g., a patterned layer) including openings, forming a polishing target layer including a non-metal-containing film on the featured pattern on the substrate (e.g., filling the openings and covering) the feature pattern, and chemical mechanical polishing of the polishing target layer using a chemical mechanical polishing slurry on a polishing pad, wherein the chemical mechanical polishing slurry includes deionized water, nanoclusters including cerium, and a pH control agent, an inhibitor, a booster, and/or a dispersant, and the nanoclusters including cerium include cerium hexanuclear nanoclusters including six cerium atoms.

BRIEF DESCRIPTION OF THE DRAWINGS

Example embodiments of the present inventive concept will be more clearly understood from the following detailed description taken in conjunction with the accompanying drawings in which.

DETAILED DESCRIPTION

Hereinafter, example embodiments of the present inventive concept will be described in detail with reference to the accompanying drawings.

The chemical mechanical polishing slurry according to some embodiments of the present inventive concept may be a slurry that may be used in a chemical mechanical polishing process for planarizing a film or a layer (e.g., a non-metal-containing film or a non-metal-containing film) and may include abrasive particles including cerium. For example, the chemical mechanical polishing slurry may include nanoclusters (also referred to as nanocluster particles) including cerium, a pH control agent (also referred to as a pH adjuster), deionized water, an inhibitor, and a dispersing agent. The chemical mechanical polishing slurry according to some embodiments of the present inventive concept may be manufactured by using a synthesis method performed at room temperature described with reference to FIG. 1.

Figure 1:
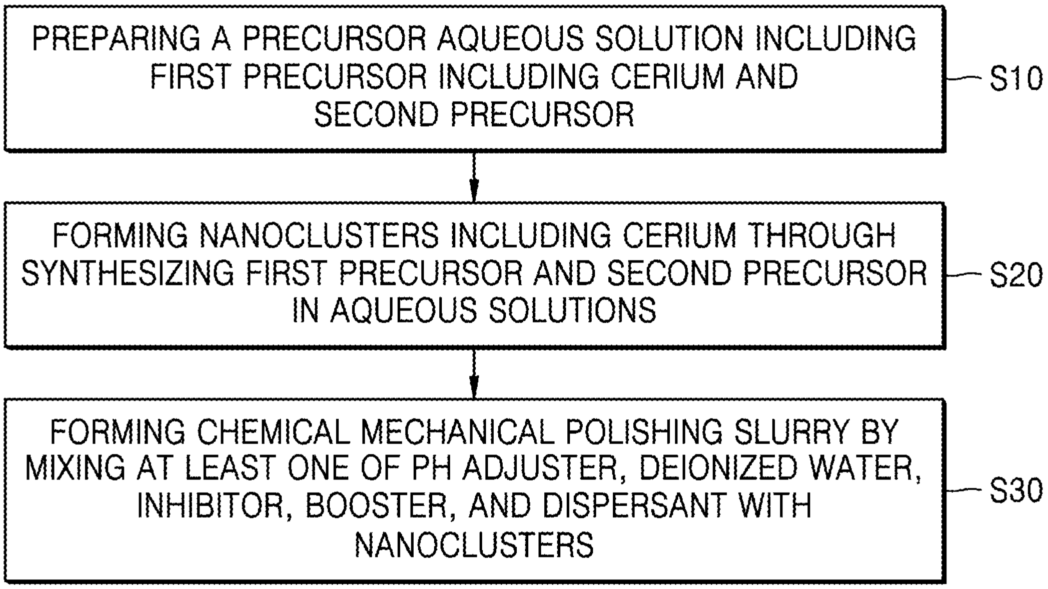
FIG. 1 is a flowchart showing a method of manufacturing a chemical mechanical polishing slurry, according to some embodiments of the present inventive concept.

FIG. 1 is a flowchart showing a method of manufacturing a chemical mechanical polishing slurry, according to some embodiments of the present inventive concept.

Referring to FIG. 1, an aqueous precursor solution including a first precursor including cerium and a second precursor may be prepared (Operation S10).

In example embodiments, the first precursor may include cerium. For example, the first precursor may include a tetravalent cerium salt. For example, the first precursor may include cerium ammonium nitrate. The second precursor may include at least one of carboxylic acid, amino acid, nitrate, and chlorine. In some embodiments, the first precursor may be different from the second precursor. As used herein, “a compound including at least one of components A, B and C” (or similar language) means that the compound is or includes the components A, B and/or C. The term “and/or” includes any and all combinations of one or more of the associated listed items.

In example embodiments, an aqueous solution of the first precursor may be formed by mixing the first precursor in deionized water, and then an aqueous solution of the precursor may be prepared by mixing the second precursor in the aqueous solution of the first precursor. In some other embodiments, an aqueous precursor solution may be prepared by mixing the second precursor in deionized water to form an aqueous solution of the second precursor, and then mixing the first precursor in the aqueous solution of the second precursor.

In example embodiments, the amount of the first precursor and the second precursor mixed in deionized water may be in a range from about 10:2 to about 10:3 as a mass ratio. For example, the mass of the second precursor may be added to the aqueous solution at a ratio of 0.2 to 0.3 relative to the mass of the first precursor. In some other embodiments, the amount of the first precursor and the second precursor mixed in the deionized water may be in a range from about 10:2 to about 10:4, or from about 10:1 to about 10:3, or from about 10:3 to about 10:5.

In example embodiments, the first precursor may be cerium ammonium nitrate. The second precursor may be an amino acid, for example, glycine. For example, a mass ratio of the first precursor:the second precursor:deionized water for forming the aqueous precursor solution may be about 10:2~3:5~20. For example, a mass ratio of the first precursor:the second precursor may be about 10:2 to about 10:3, and a mass ratio of the first precursor:deionized water may be about 10:5 to about 10:20. In some embodiments, the aqueous precursor solution may be an aqueous solution having a yellow color.

In example embodiments, the mixing the first precursor and the second precursor may be performed at pH in a range from about 0 to about 1. For example, an aqueous precursor solution including the first precursor and the second precursor may have pH in a range from about 0 to about 1. In some other embodiments, an appropriate amount of pH control agent may be further added to the aqueous precursor solution so that the aqueous precursor solution including the first precursor and the second precursor has pH in a range from about 0 to about 1.

Thereafter, nanoclusters including cerium may be formed through the synthesis of the first precursor and the second precursor in the aqueous precursor solution (Operation S20).

In example embodiments, the synthesis reaction of the first precursor and the second precursor may be performed at a temperature in a range from about 10 °C. to about 30 °C. For example, the synthesis reaction of the first precursor and the second precursor may be performed at room temperature, and there is no heating operation by a separate heating component or a heat treatment such as a separate calcination operation or hydrothermal synthesis operation for the synthesis reaction.

In example embodiments, a nanocluster including cerium may be synthesized by a synthesis reaction of the first precursor and the second precursor in the aqueous precursor solution.

For example, the nanocluster including cerium may be a cerium hexanuclear nanocluster including 6 cerium atoms.

In example embodiments, the nanoclusters including cerium may be or may include a compound of a formula $[Ce_6O_x(OH)_{8-x}(CH_2NH_2COOH)_8]\ A_y$, where A may be or may include carboxylic acid, amino acid, nitrate, and/or chlorine ion, $0<x<8$, and $4\leq y\leq 8$.

The cerium hexanuclear nanocluster may have a Lindqvist polyoxometallate structure as described with reference to FIG. 2. Nanoclusters including cerium may have a three-dimensional frame structure of polyanions having a unique crystal structure formed by a method of synthesizing the first precursor and the second precursor. In example embodiments, as the nanoclusters including cerium have a Lindqvist polyoxometallate structure, the nanoclusters may have a uniform size, for example, a uniform size distribution of 1 to 2 nm.

In example embodiments, a saturated aqueous solution of NaCl may be added to the aqueous precursor solution to promote nanocluster formation and/or crystallization. For example, by the addition of a saturated aqueous solution of NaCl, nanoclusters including cerium may be crystallized, purified, and/or recovered at a relatively rapid rate.

For example, when a saturated NaCl aqueous solution is added, the nanocluster synthesis process may be represented by the formula below.

$$6\cdot(NH_4)_2Ce(NO_2)_6+8\cdot CH_2NH_2COOH+8\cdot NaCl+22\cdot H_2O\longrightarrow\underbrace{[Ce_5O_4(OH)_4(CH_2NH_2COOH)_8(NO_3)_4]Cl_8\cdot 14H_2O}_{\text{Ce6 Lindquist nanocluster}}+8\cdot Na^+ + 12\cdot NH_4^+ + 12\cdot H^+ + 32\cdot NO_3.$$

Thereafter, a chemical mechanical polishing slurry may be formed by mixing at least one of a pH control agent, deionized water, a booster, an inhibitor, and a dispersing agent with nanoclusters including cerium (Operation S30).

In example embodiments, nanoclusters including cerium may serve as abrasive particles that aid in etching or planarization of a non-metal-containing film in a chemical mechanical polishing slurry. For example, the non-metal-containing film may include an insulating material, a low-k dielectric material, or a semiconductor material, and may include, for example, polysilicon, silicon oxide, silicon nitride, silicon oxynitride, silicon carbon oxide, silicon carbon nitride, and the like.

For example, when a chemical mechanical polishing process is performed using nanoclusters including cerium, strong bonds may be formed between silicon atoms included in the non-metal-containing film and cerium atoms of the nanoclusters including cerium. For example, in the chemical mechanical polishing process, silicon atoms included in the non-metal-containing film and cerium atoms of nanoclusters including cerium form a relatively strong bond of silicon-oxygen-cerium, thereby increasing the removal rate of the non-metal-containing film including silicon.

In example embodiments, nanoclusters including cerium may have a zeta potential of about 30 mV to about 55 mV and may have a relatively high dispersion force within a chemical mechanical polishing slurry. Accordingly, scratches or local dishing of a polishing target layer (e.g., non-metal-containing film), which may occur when abrasive particles are agglomerated or aggregated in the chemical mechanical polishing slurry, may be reduced or prevented, and the polishing performance of the chemical mechanical polishing slurry may be improved.

In example embodiments, the pH control agent may include an inorganic or organic acid in a range from about 0.1 wt % to about 10 wt %. In example embodiments, the pH control agent may include at least one of the inorganic acids (e.g., phosphoric acid, nitric acid, sulfuric acid, hydrochloric acid), or at least one of acetic acid, methanesulfonic acid, ethanesulfonic acid, benzenesulfonic acid, sulfamic acid, sulfanilic acid, malonic acid, glycolic acid, formic acid, citric acid, oxalic acid, propionic acid, acrylic acid, lactic acid, and butyric acid.

In example embodiments, the pH control agent may be included in an amount suitable for adjusting the pH of the chemical mechanical polishing slurry. For example, the chemical mechanical polishing slurry may have pH in a range of about 2 to about 10, and in this range, the zeta potential of the chemical mechanical polishing slurry may be adjusted at an appropriate level or may be optimized. In example embodiments, for example, the pH control agent may be included in the chemical mechanical polishing slurry in a range from about 0.1 wt % to about 10 wt %. When the content of the pH control agent is less than 0.1 wt %, the planarization rate of the non-metal-containing film may decrease and the planarization time may increase, and accordingly, the throughput of the chemical mechanical polishing process may decrease. When the content of the pH control agent is greater than 10 wt %, the etching selectivity with respect to a lower film quality of the non-metal-containing film may be reduced, for example, the etching rate of materials (particularly the lower film material) other than the polishing target layer may also increase, and the precise control of the planarization process of the polishing target layer may be difficult.

In example embodiments, the inhibitor may inhibit corrosion of the polishing target layer and may include, for example, triazole and derivatives thereof, and benzene triazole and derivatives thereof. The triazole derivative includes, for example, but is not limited to, amino-substituted triazole compounds and bi-amino-substituted triazole compounds. The inhibitor may be mixed in an amount of ranging from about 0.001 wt % to about 0.15 wt % in the chemical mechanical polishing slurry. In some embodiments, the amount of inhibitor may be in a range from about 0.0025 wt % to about 0.1 wt %, or from about 0.005 wt % to about 0.05 wt %.

In example embodiments, the booster may include either an organic polishing booster or an inorganic polishing booster. In example embodiments, the booster may include a material having a sulfonate group, for example, a sulfonic acid, a sulfonate, or a sulfonate salt. In example embodiments, the booster may include a material having phosphate group, for example, a phytic acid or sodium phytate. In example embodiments, the booster may include an inorganic salt, for example, sodium chloride or potassium chloride. For example, the booster may be added into the chemical mechanical polishing slurry in an amount of ranging from about 10 ppm to about 100,000 ppm.

In example embodiments, the dispersing agent may include at least one of alcohols including ethylene oxide, ethylene glycol, glycol distearate, glycol monostearate, glycol polymerate, glycol ethers, alkylamines, a compound including polymerate ethers, vinyl pyrrolidone, celluloses, and ethoxylates.

In example embodiments, the chemical mechanical polishing slurry may further include a surfactant, if necessary. The surfactant may be mixed in a mixing ratio in a range from about 0.001 wt % to about 0.5 wt % in the chemical mechanical polishing slurry, and an appropriate one selected from among nonionic surfactants, cationic surfactants, anionic surfactants, and amphoteric surfactants may be used.

In example embodiments, the chemical mechanical polishing slurry may further include a biocide for reducing or preventing biofilm formation. In some embodiments, the biocide may include, for example, tetramethylammonium chloride, tetraethylammonium chloride, etc., but is not limited thereto.

According to the method of manufacturing a chemical mechanical polishing slurry according to some embodiments, nanoclusters having a multivalent anion structure may be manufactured by a precursor synthesis method at room temperature. An abrasive slurry including nanoclusters may include uniformly distributed abrasive particles having a small size and may also have high dispersing properties in a slurry. Accordingly, scratches that may occur on the polishing target layer in a chemical mechanical polishing process may be reduced or prevented and polishing properties may be improved.

Figure 2:
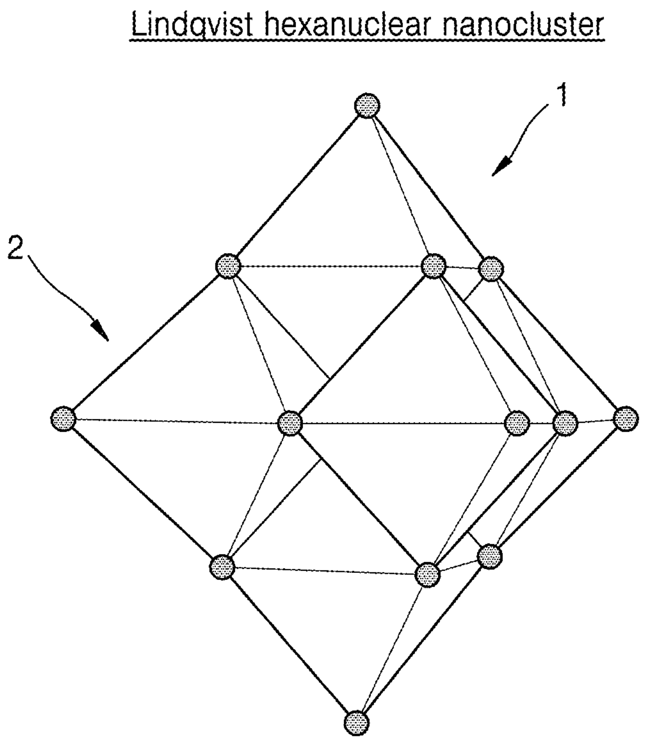
FIG. 2 is a schematic diagram showing a crystal structure of a nanocluster included in a chemical mechanical polishing slurry according to some embodiments of the present inventive concept.

FIG. 2 is a schematic diagram showing a crystal structure of a nanocluster 1 included in a chemical mechanical polishing slurry according to example embodiments of the present inventive concept.

Referring to FIG. 2, the nanocluster 1 including cerium may be a nanocluster including 6 cerium atoms. For example, 6 cerium atoms may be disposed in one particle in the form of a hexanuclear nanocluster. The nanocluster 1 including cerium may be or may include a compound of a formula $[Ce_6O_x(OH)_{8-x}(CH_2NH_2COOH)_8]\ A_y$, where A may be or may include carboxylic acid, amino acid, nitrate, and/or chlorine ion, $0<x<8$, and $4\leq y\leq 8$.

In example embodiments, the nanocluster 1 including cerium may have a Lindqvist polyoxometalate structure. For example, the Lindqvist polyoxometalate structure may refer to a structure in which polyatomic ions are connected to each other by sharing oxygen atoms to form a three-dimensional frame. For example, as shown in FIG. 2, the polyoxometallate structure includes six polyanion polyhedrals 2, and a cerium tetravalent ion is disposed at the center of each polyanion polyhedral 2. The nanocluster 1 including cerium may have a structure in which six polyvalent ion polygons 2 each having an octahedron shape are connected in an octahedron array.

Specifically, the hexanuclear nanocluster arranged in the Lindqvist polyoxometalate structure has 6 cerium atoms, 4 —O groups, and 4 —OH groups. The hexanuclear nanocluster may have a positive charge of +12, and may be surrounded by an amino acid, such as glycine, or an anion, such as chloride ion or nitrate ion to stabilize the positive charge of +12.

According to the method of manufacturing a chemical mechanical polishing slurry according to some embodiments, nanoclusters 1 including cerium may be synthesized to have a specific crystal structure as shown in FIG. 2, and nanoclusters 1 may be formed to have high thermodynamic stability at a relatively low synthesis temperature. Accordingly, when the nanoclusters 1 are dispersed in an aqueous solution, a relatively large repulsive force between anions may occur, and such nanoclusters 1 may have a relatively high zeta potential. In addition, the nanoclusters 1 may be formed to have a small size (e.g., a minimum size) that an oxide including cerium may have, and for example, the nanoclusters 1 may have a particle size in a range from about 1 nm to about 2 nm.

Figure 3:
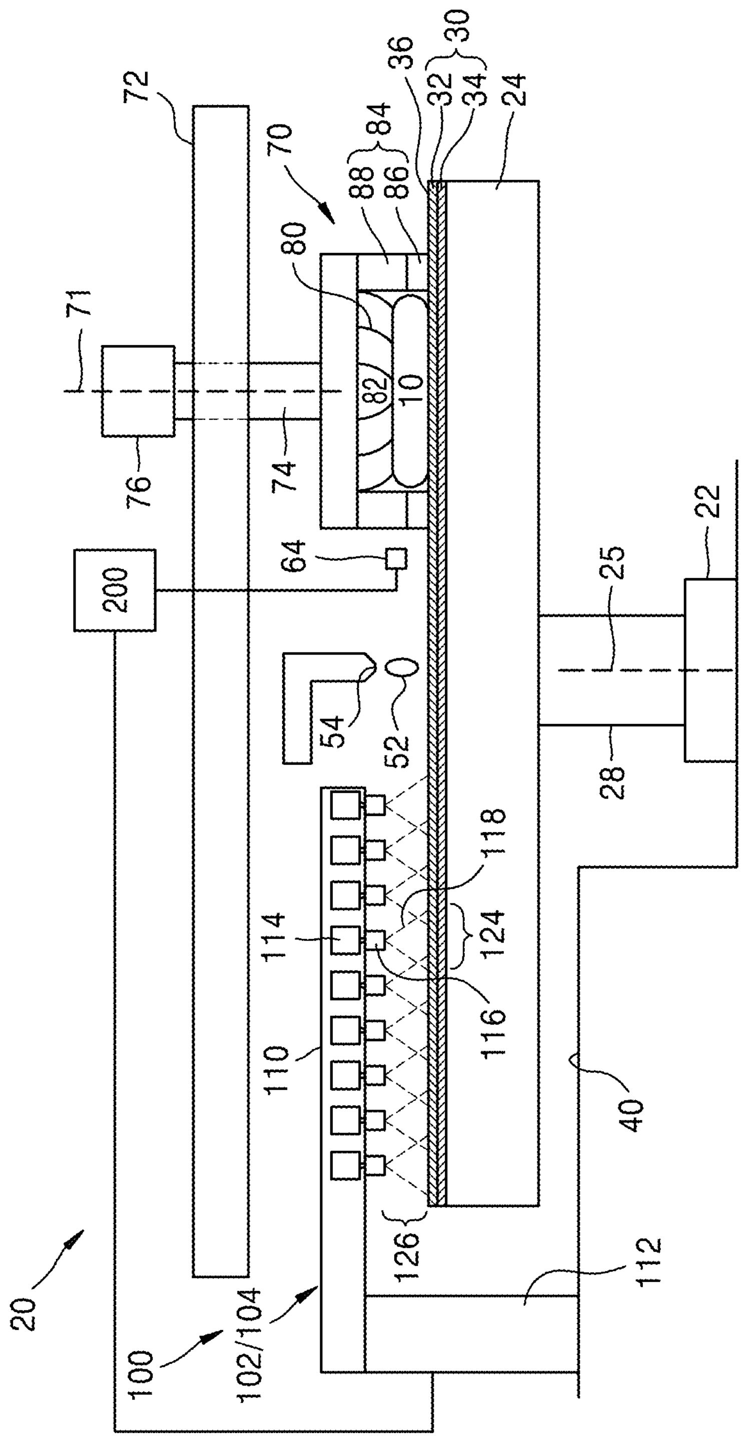
FIG. 3 is a schematic cross-sectional view illustrating an example of a chemical mechanical polishing apparatus using a chemical mechanical polishing slurry according to some embodiments of the present inventive concept.
Figure 4:
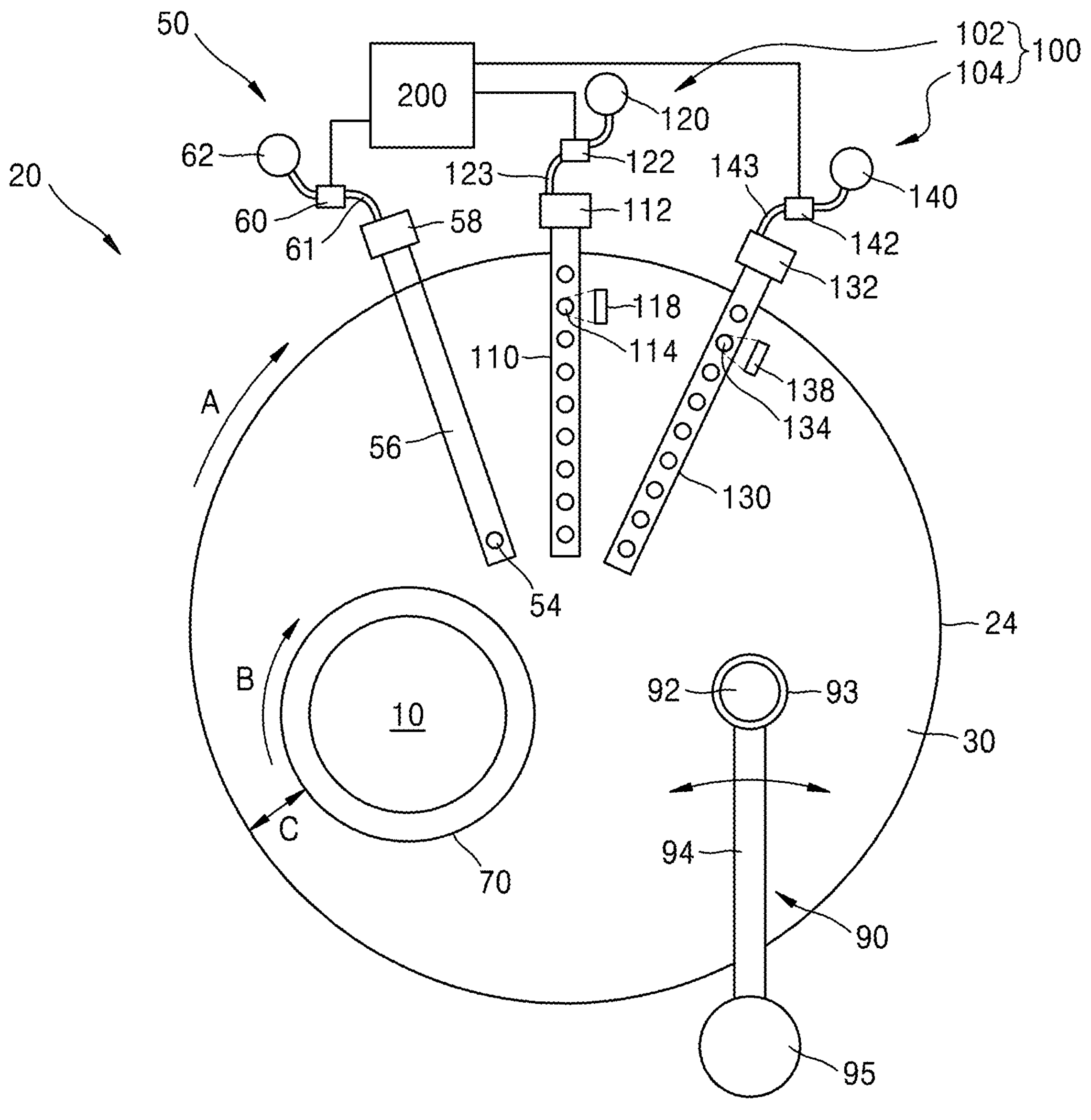
FIG. 4 is a schematic plan view showing the chemical mechanical polishing apparatus of FIG. 3 according to some embodiments of the present inventive concept.

FIG. 3 is a schematic cross-sectional view illustrating an example of a chemical mechanical polishing apparatus 20 using a chemical mechanical polishing slurry according to some embodiments of the present inventive concept, and FIG. 4 is a schematic plan view showing the chemical mechanical polishing apparatus 20 of FIG. 3, according to some embodiments of the present inventive concept.

Specifically, the chemical mechanical polishing apparatus 20 may include a platen 24 having a rotatable disk-shape, on which a polishing pad 30 is positioned. The chemical mechanical polishing apparatus 20 may also be referred to as a polishing station. The platen 24 may rotate about a central axis 25. The platen 24 may rotate about the central axis 25 as indicated by the arrow A in FIG. 4. A motor 22 may rotate a driving shaft 28 to rotate the platen 24.

In some embodiments, the polishing pad 30 may be a dual polishing pad having a lower polishing pad 34 and an upper polishing pad 32. The upper polishing pad 32 may include a softer material than the lower polishing pad 34. The chemical mechanical polishing apparatus 20 may include a polishing liquid supply system 50 for supplying a chemical mechanical polishing slurry 52 (or polishing liquid) onto the polishing pad 30 through a port 54.

The polishing liquid supply system 50 may include an arm 56 supported by a base 58 to extend over the platen 24. The port 54 may be disposed at an end of the arm 56. The port 54 may be coupled to an abrasive liquid supply unit 62, for example, a storage or tank storing the chemical mechanical polishing slurry 52 via a control valve 60 and a pipe 61.

A carrier head 70 may operate while supporting the substrate 10 in contact with the polishing pad 30. As described below, the substrate 10 may be a substrate structure having a metal layer formed thereon. The carrier head 70 may be referred to as a polishing head. The carrier head 70 may be coupled to a support structure 72. The carrier head 70 may be rotated about a central axis 71 by being connected to a rotation motor 76 via a drive shaft 74.

The carrier head 70 may include a flexible membrane 80 having a substrate mounting surface for contacting a back side (or rear surface) of the substrate 10 and a pressurization chamber 82 for applying pressure on the substrate 10. The carrier head 70 may include a retaining ring 84 for supporting (e.g., holding) the substrate 10. The retaining ring 84 may include a lower retaining ring 86 and an upper retaining ring 88.

During an operation of the chemical mechanical polishing apparatus 20, the platen 24 is rotated about the central axis 25, and the carrier head 70 may be rotated about the central axis 71 as shown by arrow B in FIG. 4 and may be moved laterally across an upper surface of the polishing pad 30 as shown by arrow C in FIG. 4.

The chemical mechanical polishing apparatus 20 may include a pad conditioner 90 having a conditioner disk 92 held by a conditioner head 93 at an end of a conditioner arm 94. The conditioner disk 92 may be used to maintain the surface roughness of the polishing pad 30. The conditioner arm 94 may be supported by a conditioner base 95.

The chemical mechanical polishing apparatus 20 may include a temperature sensor 64 for monitoring the temperature of the chemical mechanical polishing slurry 52 on the polishing pad 30 and/or the polishing pad 30. For example, the temperature sensor 64 may be located on the polishing pad 30 and may be an infrared ray (IR) sensor, for example, an IR camera configured to measure the temperature of the chemical mechanical polishing slurry 52 on the polishing pad 30 and/or the polishing pad 30.

The temperature sensor 64 may be configured to measure temperature at multiple points along the radius of polishing pad 30 to generate a radial temperature profile. For example, an IR camera constituting the temperature sensor 64 may have a field of view that spans the radius of the polishing pad 30.

In some embodiments, the temperature sensor 64 may be a contact sensor rather than a non-contact sensor as in FIG. 3. For example, the temperature sensor 64 may be a thermocouple or an IR thermometer located on or in the platen 24. The temperature sensor 64 may be in direct contact with the polishing pad 30. In some embodiments, a plurality of temperature sensors 64 may be spaced apart at radial positions of the polishing pad 30 to measure and/or provide temperatures at multiple points along the radius of the polishing pad 30.

Although the temperature sensor 64 is illustrated in FIG. 3 as being positioned to monitor the temperature of the polishing pad 30 and/or the chemical mechanical polishing slurry 52 on the polishing pad 30, the temperature sensor 64 may be located inside the carrier head 70 to measure the temperature of the substrate 10. The temperature sensor 64 may be a contact sensor that directly contacts the substrate 10, in some embodiment, that is, a semiconductor wafer.

The chemical mechanical polishing apparatus 20 may include a temperature control system 100 for controlling the temperature of the chemical mechanical polishing slurry 52 on the polishing pad 30 and/or the polishing pad 30. The temperature control system 100 may deliver a heating fluid 118 and a cooling fluid 138 onto a polishing surface 36 of the polishing pad 30. The temperature control system 100 may deliver the heating fluid 118 and the cooling fluid 138 onto the chemical mechanical polishing slurry 52 already present on the polishing pad 30. The temperature control system 100 may include a heating system 102 and a cooling system 104.

The heating system 102 may deliver the heating fluid 118, for example, hot water or steam. The cooling system 104 may deliver the cooling fluid 138, for example, chilled water or cooling air. The heating fluid 118 and the cooling fluid 138 may be delivered through nozzles 116 and openings 114 and 134 provided by arms 110 and 130.

In some embodiments, the heating system 102 may include the arm 110 extending from an edge of the polishing pad 30 to the center or at least near the center of the polishing pad 30 over the platen 24 and the polishing pad 30. The arm 110 may be supported by a base 112. The base 112 may be supported on the same frame 40 as the platen 24.

The base 112 may include one or more actuators, such as a linear actuator to raise or lower the arm 110 and/or a rotary actuator to swing the arm 110 laterally over the platen 24. The arm 110 may be positioned to avoid collision with other hardware components, such as the carrier head 70, the pad conditioning disk 92, the arm 56 for supplying chemical mechanical polishing slurry, and the arm 130 for supplying cooling fluid.

A plurality of openings 114 are formed in the lowermost surface of the arm 110. The openings 114 may be configured to direct the heating fluid 118, for example, a gas or vapor (or steam), onto the polishing pad 30. In some embodiments, the openings 114 may communicate with nozzles 116 that direct the ejected heating fluid 118 in the form of a spray onto the polishing pad 30. Although the openings 114 and the nozzles 116 are shown separately in FIG. 3, the openings 114 and the nozzles 116 may be a single unit or a single body, or the nozzles 116 may be disconnected and the heating fluid 118 may be discharged directly through the openings 114 in the form of a spray.

The openings 114 may direct the heating fluid 118 in a radial pattern 124 on polishing pad 30. In FIG. 4, openings 114 are shown as being equally spaced, but the present inventive concept is not limited thereto. The openings 114 may be more densely clustered toward the center of the polishing pad 30. FIG. 4 illustrates nine openings 114, but, in some embodiments, more or fewer openings 114 may be present.

The arm 110 may be supported by the base 112 to be separated from the polishing pad 30. A separation distance 126 between the openings 114 (and/or nozzles 116) and the polishing pad 30 may be in a range from about 0.5 mm to about 5 mm. In particular, the separation distance 126 may be selected such that heat of the heating fluid 118 does not significantly dissipate before reaching the polishing pad 30. For example, the separation distance 126 may be selected so that the heating fluid 118 ejected from the openings 114 does not condense before reaching the polishing pad 30.

The heating system 102 may include a source 120 of the heating fluid 118, and the source 120 may be connected to the arm 110 via a control valve 122 and a fluid pipe 123. In some embodiments, the source 120 may be a steam generator, for example, a vessel in which water is boiled to produce steam.

The heating fluid 118 may be mixed with another gas (e.g., air), and/or a liquid (e.g., heated water), or the heating fluid 118 may be substantially pure steam. When steam is used as the heating fluid 118, when the steam is generated in the fluid supply source 120, the temperature of the steam may be in a range from about 90 °C. to about 200 °C. The temperature of the steam may be between about 90 °C. and about 150 °C. when the steam is distributed through the openings 114, for example, due to heat loss during transport. In some embodiments, steam may be delivered by the openings 114 at a temperature between about 60 °C. and about 100 °C., for example, between about 60 °C. and about 75 °C.

The chemical mechanical polishing apparatus 20 may include the cooling system 104. The cooling system 104 may be configured similarly to the heating system 102 as described above. The arm 130 may be supported by a base 132. The arm 130 may be connected to a supply source 140 via a control valve 142 and a pipe 143. However, the supply source 140 is a source of the cooling fluid 138, and the cooling system 104 may supply the cooling fluid 138 in the form of a spray onto the polishing pad 30.

The cooling fluid 138 may be a liquid, for example, water below 20 °C., a gas below 20 °C., or a mixture of a liquid and gas. The cooling fluid 138 may be air with aerosolized water droplets. Openings 134 may have the same configuration as the openings 114 for supplying the heating fluid 118 described above. The openings 134 may have the same connection configuration as the nozzles 116 described above.

The chemical mechanical polishing apparatus 20 may include a controller 200 for controlling the operation of various components, for example, the polishing liquid supply system 50 and the temperature control system 100. The controller 200 may be configured to receive a measured temperature from the temperature sensor 64. The controller 200 may compare the measured temperature to a target temperature and control the control valves 122 and/or 142 to control a flow rate of the heating fluid 118 and/or the cooling fluid 138 onto the polishing pad 30 to achieve the target temperature.

Figure 5:
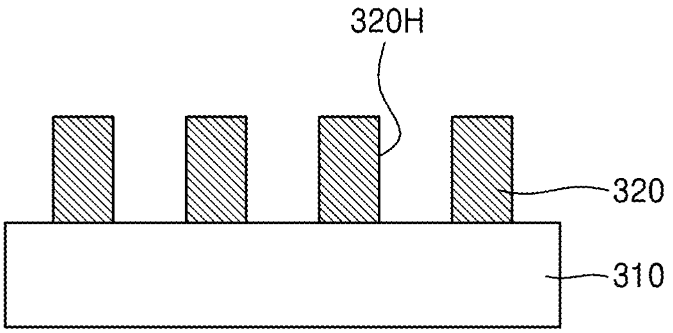
FIGS. 5 to 7 are cross-sectional views illustrating a method of manufacturing a semiconductor device including a chemical mechanical polishing operation using a chemical mechanical polishing slurry according to some embodiments of the present inventive concept.
Figure 6:
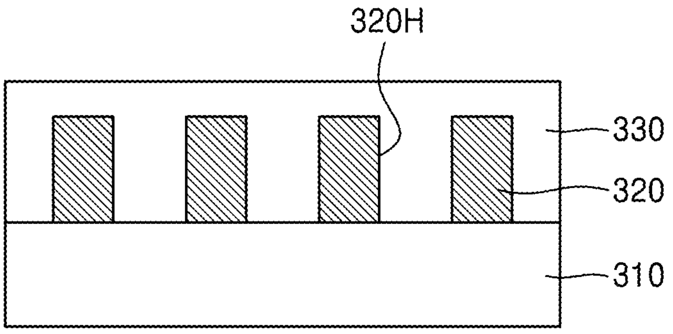
Figure 7:
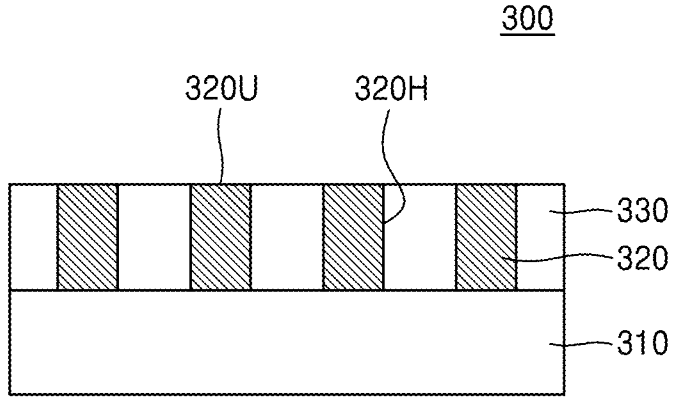

FIGS. 5 to 7 are cross-sectional views illustrating a method of manufacturing a semiconductor device 300 including a chemical mechanical polishing operation using a chemical mechanical polishing slurry according to some embodiments of the present inventive concept.

Specifically, the method of manufacturing the semiconductor device 300 of FIGS. 5 to 7 may include a chemical mechanical polishing operation (process). The chemical mechanical polishing operation may be performed using the chemical mechanical polishing apparatus 20 of FIGS. 3 and 4.

Referring to FIG. 5, a feature pattern 320 having a plurality of openings 320H spaced apart from each other in a horizontal direction is formed on a substrate 310. The feature pattern 320 may be obtained by forming openings 320H exposing predetermined regions of the substrate 310 by forming a film or a layer (e.g., a metal film or a metal layer) on the substrate 310 and then selectively etching the film of the layer using a photolithography process. The openings 320H may be line-shaped trenches or plug-shaped holes. The feature pattern 320 is also referred to as a patterned layer.

As the substrate 310, various substrates used in manufacturing semiconductor devices may be used. In some embodiments, the substrate 310 may include a silicon substrate. In some embodiments, the feature pattern 320 may include a metal layer.

Referring to FIG. 6, a polishing target layer 330 covering the feature pattern 320 may be formed on the substrate 310. The polishing target layer 330 may include portions formed in the openings 320H of the feature pattern 320 and may extend on an upper surface of the feature pattern 320. In some embodiments, the polishing target layer 330 may be formed to a thickness sufficiently large to completely fill an inside of the openings 320H and completely cover the upper surface of the feature pattern 320.

In example embodiments, the polishing target layer 330 may include, for example, an insulating material, a low-k dielectric material, or a semiconductor material, such as polysilicon, silicon oxide, silicon nitride, silicon oxynitride, silicon carbon oxide, silicon carbon nitride, and the like.

In example embodiments, the polishing target layer 330 may be formed by using, for example, a physical vapor deposition (PVD) method, a chemical vapor deposition (CVD) method, a metal organic CVD (MOCVD) method, or an atomic layer deposition (ALD) method.

Referring to FIG. 7, an upper surface of the polishing target layer 330 is chemically mechanically polished using the chemical mechanical polishing slurry 52 (refer to FIG. 3) on the polishing pad 30 (refer to FIGS. 3 and 4) of the chemical mechanical polishing apparatus 20 (refer to FIGS.

3 and 4). For example, in a chemical mechanical polishing process, the polishing target layer 330 may be planarized by removing an upper portion (e.g., the upper surface) of the polishing target layer 330 until an upper surface 320U of the feature pattern 320 is exposed.

In example embodiments, as shown in FIG. 7, the upper surface of the polishing target layer 330 may be planarized to be coplanar with the upper surface 320U of the feature pattern 320 by planarizing the polishing target layer 330. In some other embodiments, the upper surface of the polishing target layer 330 may be planarized so that the upper surface 320U of the feature pattern 320 is exposed, and the polishing target layer 330 may be recessed from the upper surface 320U of the feature pattern 320 by further removing a portion of the upper surface of the polish target layer 330. In some embodiments, the recess depth may be in a range from about 1% to about 5% of a height of the feature pattern 320.

The chemical mechanical polishing operation (process) may be performed by a combination of mechanical abrasion and chemical etching of the polishing target layer 330 at an interface between the polishing target layer 330 on the substrate 310 and the polishing pad 30 using the chemical mechanical polishing slurry 52 (refer to FIG. 3). The chemical mechanical polishing slurry used in the chemical mechanical polishing operation (process) may include cerium-including nanoclusters as abrasive particles, and the cerium-including nanoclusters may have high dispersibility and a uniform and small size. The polishing target layer 330 may be polished with a high polishing rate and/or may have improved planarity or flatness due to strong bonding between silicon atoms included in the polishing target layer 330 and cerium atoms included in the chemical mechanical polishing slurry 52. In addition, scratches that may occur on the surface of the polishing target layer 330 when abrasive particles having a relatively large particle size or agglomerated are supplied on the surface of the polishing target layer 330 may be reduced or prevented.

Figure 8:
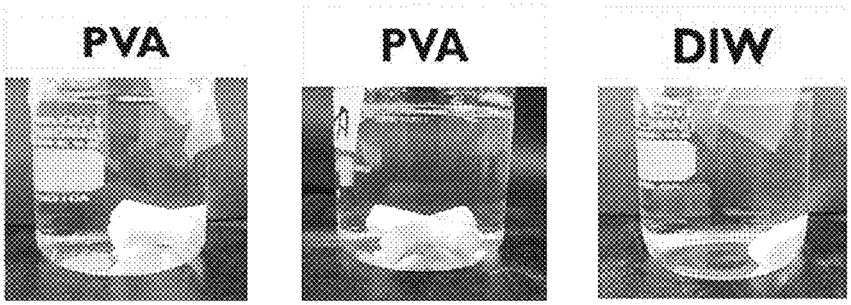
FIG. 8 shows images showing results of a dispersity test of nanocluster particles manufactured by a method of manufacturing a chemical mechanical polishing slurry, according to some embodiments of the present inventive concept.

FIG. 8 shows images of results of a dispersity test of nanocluster particles manufactured by using a method of manufacturing a chemical mechanical polishing slurry, according to some embodiments of the present inventive concept.

Referring to FIG. 8, nanoclusters synthesized at room temperature according to the method described with reference to FIG. 1 were dispersed in a polyvinyl alcohol (PVA) aqueous solution. At pH 3, 5, and 7, the nanoclusters dispersed in the PVA aqueous solution were uniformly dispersed in the solution, and it was visually observed that no aggregates or precipitates were formed in the PVA aqueous solution.

Figure 9:
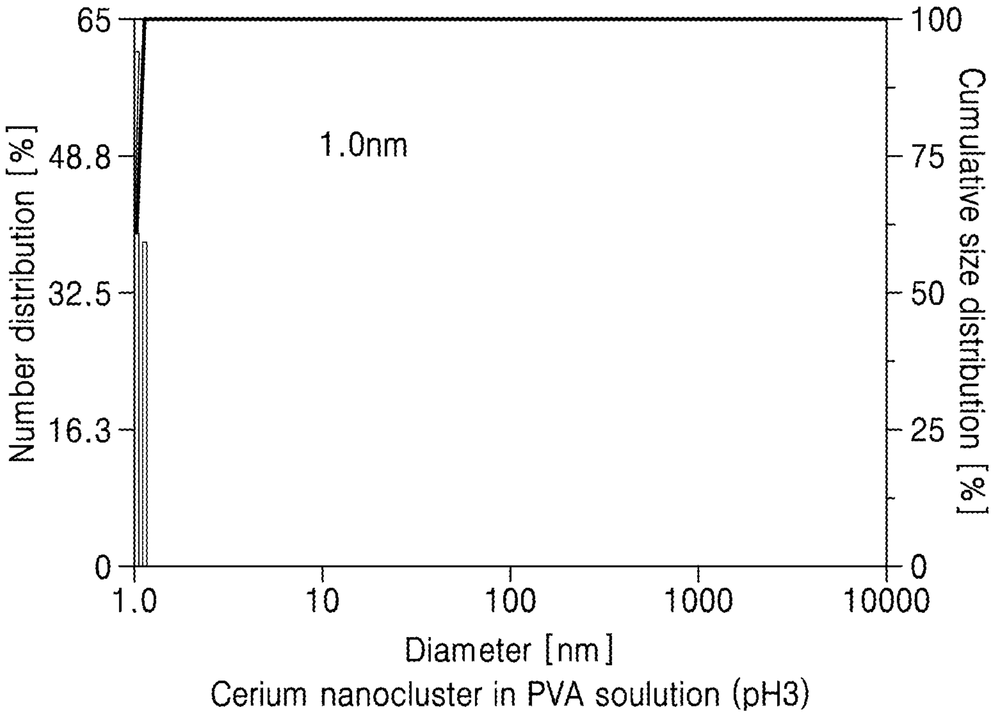
FIG. 9 is a graph showing a size distribution of nanocluster particles manufactured by a method of manufacturing a chemical mechanical polishing slurry, according to some embodiments of the present inventive concept.

FIG. 9 is a graph showing the size distribution of nanocluster particles manufactured by a method of manufacturing a chemical mechanical polishing slurry, according to some embodiments of the present inventive concept.

Referring to FIG. 9, the particle size distribution of nanoclusters including cerium dispersed in an amount of 0.3 wt % in a PVA aqueous solution was measured using a dynamic light scattering (DLS) method. It was observed that more than 99% of the total particles of the nanoclusters dispersed in the PVA aqueous solution had a particle size of less than 1.0 nm. In particular, most of the particles of the nanoclusters including cerium had a particle size ranging from about 1.0 to about 1.1 nm. That is, it was confirmed that the nanoclusters synthesized at room temperature according to some embodiments of the present inventive concept had a uniform and small particle size.

In addition, it may be confirmed that the primary particles of the nanocluster do not aggregate or attach to each other and/or do not form large secondary particles, and the primary particles of the nanocluster are dispersed in the PVA aqueous solution as they are synthesized.

Figure 10:
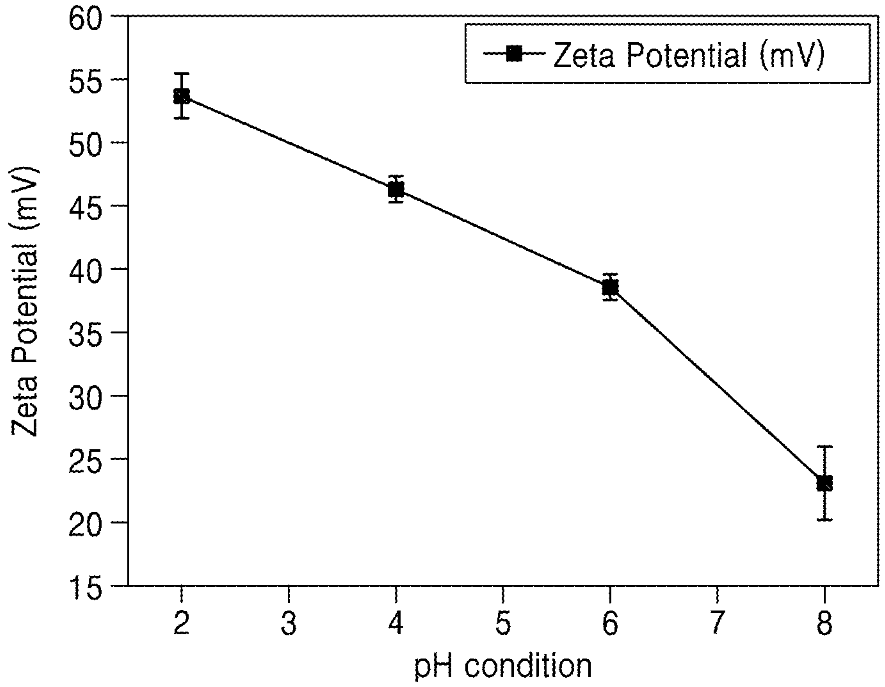
FIG. 10 is a graph showing a zeta potential of nanoclusters manufactured by a method of manufacturing a chemical mechanical polishing slurry, according to some embodiments of the present inventive concept, as a function of pH change.

FIG. 10 is a graph showing a zeta potential of nanoclusters manufactured by a method of manufacturing a chemical mechanical polishing slurry, according to some embodiments of the present inventive concept, as a function of pH change.

Referring to FIG. 10 and Table 1, nanoclusters including cerium synthesized at room temperature according to the method described with reference to FIG. 1 had a zeta potential ranging from about 53.8 mV to about 23.1 mV under conditions of pH 2 to pH 8. In particular, it may be confirmed that the nanoclusters have a positive charge under the conditions of pH 2 to pH 8, and this is assumed that because the nanoclusters have a three-dimensional structure with polyvalent anions. In particular, it may be assumed that the positive charge is uniformly distributed on a surface of the nanocluster due to the three-dimensional arrangement of glycine ions surrounding the cerium central atom. For example, nanoclusters according to some embodiments of the present inventive concept have a zeta potential value of up to about 53.8 mV, which is generally significantly higher than that of cerium oxide or colloidal ceria particles formed by a calcination method or a hydrothermal synthesis method.

TABLE 1

| | Conditions | zeta potential (mV) | Error (mV) |
|---|---|---|---|
| Experimental Example 1 | pH 2 | 53.7 | 1.8 |
| Experimental Example 2 | pH 4 | 46.3 | 1.1 |
| Experimental Example 3 | pH 6 | 38.6 | 0.9 |
| Experimental Example 4 | pH 8 | 23.1 | 2.8 |

As used herein, an element or region that is "covering" or "surrounding" or "filling" another element or region may completely or partially cover or surround or fill the other element or region.

While the inventive concept has been particularly shown and described with reference to some example embodiments thereof, it will be understood that various changes in form and details may be made therein without departing from the scope of the following claims. Accordingly, the above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents and shall not be restricted or limited by the foregoing detailed description.

What is claimed is:

1. A method of manufacturing a chemical mechanical polishing slurry, the method comprising:

mixing a first precursor including cerium and a second precursor in an aqueous solution;

forming nanoclusters including cerium by a synthesis reaction between the first precursor and the second precursor; and forming the chemical mechanical polishing slurry by mixing a pH control agent, deionized water, an inhibitor, and/or a dispersant with the nanoclusters.

2. The method of claim 1, wherein each of the nanoclusters includes a cerium hexanuclear nanocluster including six cerium atoms.

3. The method of claim 1, wherein the first precursor includes a tetravalent cerium salt, and the second precursor includes carboxylic acid, amino acid, nitrate, and/or chlorine.

4. The method of claim 1, wherein each of the nanoclusters includes a compound of a formula $[Ce_6O_x(OH)_{8-x}(CH_2NH_2COOH)_8]\,A_y$, and A includes a carboxylic acid ion, an amino acid ion, a nitrate ion, and/or a chlorine ion, $0<x<8$, and $4\leq y\leq 8$.

5. The method of claim 1, wherein, in the mixing the first precursor and the second precursor, a mass ratio of the first precursor to the second precursor is in a range from about 10:2 to about 10:3.

6. The method of claim 1, wherein the nanoclusters each have a particle size in a range from about 1 nm to about 2 nm.

7. The method of claim 1, wherein the mixing of the first precursor and the second precursor is performed under pH of about 0 to about 1.

8. The method of claim 1, wherein, in the forming of the nanoclusters, the synthesis reaction between the first precursor and the second precursor is carried out at a temperature in a range from about 10 °C. to about 30 °C.

9. The method of claim 1, wherein the nanoclusters each have a zeta potential in a range from about 30 mV to about 55 mV.

10. A method of manufacturing a chemical mechanical polishing slurry, the method comprising:

mixing a first precursor including cerium in an aqueous solution;

mixing a second precursor in the aqueous solution; and synthesizing nanoclusters by a synthesis reaction between the first precursor and the second precursor in the aqueous solution at a temperature in a range from about 10 °C. to about 30 °C., wherein the nanoclusters include cerium hexanuclear nanoclusters including polyvalent anions including cerium atoms.

11. The method of claim 10, wherein the first precursor includes a tetravalent cerium salt, and the second precursor includes carboxylic acid, amino acid, nitrate, and/or chlorine.

12. The method of claim 10, wherein the nanoclusters each include a compound of a formula $[Ce_6O_x(OH)_{8-x}(CH_2NH_2COOH)_8]\,A_y$, and A includes a carboxylic acid ion, an amino acid ion, a nitrate ion, and/or a chlorine ion, $0<x<8$, and $4\leq y\leq 8$.

13. The method of claim 10, wherein the nanoclusters each have a particle size in a range from about 1 nm to about 2 nm.

14. The method of claim 10, wherein the synthesizing the nanoclusters is performed at pH in a range from about 0 to about 1.

15. The method of claim 10, wherein the nanoclusters have a zeta potential in a range from about 30 mV to about 55 mV.

16. A method of manufacturing a semiconductor device, the method comprising:

forming, on a substrate, a patterned layer including openings;

forming a polishing target layer including a non-metal-containing film on the patterned layer on the substrate, the polishing target layer including portions in the openings, respectively; and chemical-mechanical polishing the polishing target layer using a chemical mechanical polishing slurry on a polishing pad, wherein the chemical mechanical polishing slurry includes:

deionized water;

nanoclusters including cerium; and a pH control agent, an inhibitor, and/or a dispersant, wherein the nanoclusters including cerium include cerium hexanuclear nanoclusters including six cerium atoms.

17. The method of claim 16, wherein the nanoclusters each have a particle size in a range from about 1 nm to about 2 nm.

18. The method of claim 16, wherein the nanoclusters each include a compound of a formula $[Ce_6O_x(OH)_{8-x}(CH_2NH_2COOH)_8]\,A_y$, and A includes a carboxylic acid ion, an amino acid ion, a nitrate ion, and/or a chlorine ion, $0<x<8$, and $4\leq y\leq 8$.

19. The method of claim 16, wherein the nanoclusters each have a zeta potential in a range from about 30 mV to about 55 mV.

20. The method of claim 19, wherein the polishing target layer includes polysilicon, silicon oxide, silicon nitride, silicon oxynitride, silicon carbon oxide, and/or silicon carbon nitride.

* * * * *